(12) United States Patent
Quint et al.

(10) Patent No.: US 7,349,816 B2
(45) Date of Patent: Mar. 25, 2008

(54) BATTERY MANAGEMENT SYSTEM AND APPARATUS WITH RUNTIME ANALYSIS REPORTING

(75) Inventors: Jonathan B. Quint, Sudbury, MA (US); Steven H. Dworkin, Newton, MA (US)

(73) Assignee: BatteryCorp, Inc., Newton, MA (US)

( * ) Notice: Subject to any disclaimer, the term of this patent is extended or adjusted under 35 U.S.C. 154(b) by 252 days.

(21) Appl. No.: 11/125,631

(22) Filed: May 10, 2005

(65) Prior Publication Data

US 2005/0234663 A1 Oct. 20, 2005

Related U.S. Application Data

(63) Continuation-in-part of application No. 11/025,816, filed on Dec. 29, 2004, which is a continuation-in-part of application No. 10/749,004, filed on Dec. 30, 2003, now Pat. No. 7,003,431.

(51) Int. Cl.
*G06F 19/00* (2006.01)
*G01R 31/36* (2006.01)

(52) U.S. Cl. ........................ 702/63; 702/183
(58) Field of Classification Search ................. 702/63, 702/183, 184; 324/426, 430; 320/109
See application file for complete search history.

(56) References Cited

U.S. PATENT DOCUMENTS

| | | | |
|---|---|---|---|
| 4,222,665 A | 9/1980 | Tachizawa et al. | 356/218 |
| 5,295,078 A * | 3/1994 | Stich et al. | 700/297 |
| 5,545,967 A | 8/1996 | Osborne et al. | 320/2 |
| 5,615,129 A * | 3/1997 | Stich et al. | 700/297 |
| 5,694,607 A * | 12/1997 | Dunstan et al. | 713/340 |
| 6,353,800 B1 | 3/2002 | Rector | 702/63 |
| 6,456,036 B1 | 9/2002 | Thandiwe | 320/106 |
| 6,832,171 B2 * | 12/2004 | Barsoukov et al. | 702/65 |
| 6,892,148 B2 * | 5/2005 | Barsoukov et al. | 702/63 |
| 6,967,890 B2 * | 11/2005 | Shen | 365/226 |
| 2004/0251907 A1 | 12/2004 | Kalley | 324/426 |

* cited by examiner

*Primary Examiner*—Bryan Bui
(74) *Attorney, Agent, or Firm*—Peter S. Canelias

(57) ABSTRACT

The invention relates to the management of large stationary batteries. The invention is a comprehensive process for the management of stationary batteries that are used for backup power and are deployed in widely dispersed locations. The OMS™ (Optimization Management System) solution is comprised of Mega-Tags (preferably serialized bar-coded identification labels), a battery testing and data acquisition device, and web-based software. The OMS™ system can automatically analyze, determine and report an estimated runtime for battery unit, such as the length of time that a backup system can provide adequate power to keep the primary equipment operational. These components work together to provide a platform for managing a large number of perishable, expensive, and geographically dispersed assets.

12 Claims, 6 Drawing Sheets

Battery Runtime Estimator
Demonstration Carrier
Albuquerque NM
Estimated Runtime less than 3 Hours
Voltage Cut Off @ 1.75 VPC

| Site Information / Climate | Battery Information | Power Required | **Specifications Amps/Hr | Runtime | Currently Available** Amps/Hr | Runtime | % Spec |
|---|---|---|---|---|---|---|---|
| NM00001A Albuquerque, NM Unknown | EnerSys Inc. NP65-12 3 strings of 4 (Baseline value = 7,515) | 5,760 Watts 120 Amps | 195 | 0 Hrs. 55 Min | 195 | 0 Hrs. 55 Min | 100 |
| NM01005P Albuquerque, NM Unknown | EnerSys Inc. SBS-40 3 strings of 4 (Baseline value = 4,600) | 5,760 Watts 120 Amps | 111 | 0 Hrs. 29 Min | 37 | 0 Hrs. 1 Min | 33 |
| | | | | | *Warning! 2 strings with bad cell(s) or missing data! | | |
| NM01009P Albuquerque, NM Unknown | EnerSys Inc. SBS-40 2 strings of 4 (Baseline value = 4,600) | 3,840 Watts 80 Amps | 74 | 0 Hrs. 29 Min | 73 | 0 Hrs. 28 Min | 99 |

Corporate Runtime Summary Report

| | # Sites Contracted | # Tested To Date | PCT Tested | Under 1 Hour Count | Pct | 1-2 Hours Count | Pct | 2-4 Hours Count | Pct | 4-6 Hours Count | Pct | 6-8 Hours Count | Pct | 8 Hours+ Count | Pct |
|---|---|---|---|---|---|---|---|---|---|---|---|---|---|---|---|
| Demonstration Carrier | 4,018 | 1,960 | 49.0% | 308 | 15.7% | 1,269 | 64.7% | 127 | 6.4% | 246 | 12.5% | 3 | 0.0% | 7 | 0.3% |

| Market | # Sites Contracted | # Tested To Date | PCT Tested | Under 1 Hour Count | Pct | 1-2 Hours Count | Pct | 2-4 Hours Count | Pct | 4-6 Hours Count | Pct | 6-8 Hours Count | Pct | 8 Hours+ Count | Pct |
|---|---|---|---|---|---|---|---|---|---|---|---|---|---|---|---|
| Albuquerque | 147 | 58 | 39.0% | 58 | 100.0% | 0 | 0.0% | 0 | 0.0% | 0 | 0.0% | 0 | 0.0% | 0 | 0.0% |
| Atlanta | 1,027 | 911 | 89.0% | 62 | 6.8% | 600 | 65.8% | 78 | 8.5% | 168 | 18.4% | 0 | 0.0% | 3 | 0.3% |
| Columbus | 195 | 0 | 0.0% | 0 | 0.0% | 0 | 0.0% | 0 | 0.0% | 0 | 0.0% | 0 | 0.0% | 0 | 0.0% |
| Denver | 485 | 0 | 0.0% | 0 | 0.0% | 0 | 0.0% | 0 | 0.0% | 0 | 0.0% | 0 | 0.0% | 0 | 0.0% |
| El Paso | 101 | 59 | 58.0% | 29 | 49.1% | 0 | 0.0% | 6 | 10.1% | 21 | 35.5% | 1 | 1.6% | 2 | 3.3% |
| Jacksonville | 507 | 494 | 97.0% | 69 | 13.9% | 363 | 73.4% | 18 | 3.6% | 44 | 8.9% | 0 | 0.0% | 0 | 0.0% |
| Milwaukee | 181 | 0 | 0.0% | 0 | 0.0% | 0 | 0.0% | 0 | 0.0% | 0 | 0.0% | 0 | 0.0% | 0 | 0.0% |
| Mobile | 308 | 308 | 100.0% | 4 | 1.2% | 285 | 92.5% | 9 | 2.9% | 10 | 3.2% | 0 | 0.0% | 0 | 0.0% |
| Phoenix | 450 | 34 | 8.0% | 28 | 82.3% | 5 | 14.7% | 1 | 2.9% | 0 | 0.0% | 0 | 0.0% | 0 | 0.0% |
| Pittsburgh | 314 | 0 | 0.0% | 0 | 0.0% | 0 | 0.0% | 0 | 0.0% | 0 | 0.0% | 0 | 0.0% | 0 | 0.0% |
| Salt Lake City | 303 | 96 | 32.0% | 58 | 60.4% | 16 | 16.6% | 15 | 15.6% | 3 | 3.1% | 2 | 2.0% | 2 | 2.0% |

FIG. 5

Market Runtime Analysis
Demonstration Carrier
Albuquerque
Sorted by: Site Name

| | Avg Runtime at spec | Avg Pct of spec | Under 1 Hour | 1-2 Hours | 2-4 Hours | 4-6 Hours | 6-8 Hours | 8 Hours + |
|---|---|---|---|---|---|---|---|---|
| Albuquerque | 0 Hrs. 29 Min | 77.0% | 54 | 0 | 0 | 0 | 0 | 0 |

| Site Name | Runtime at spec | Pct of spec | Under 1 Hour | 1-2 Hours | 2-4 Hours | 4-6 Hours | 6-8 Hours | 8 Hours + |
|---|---|---|---|---|---|---|---|---|
| DEMO000001A | 4 Hrs. 4 Min | 99.2% | | | | 4 Hrs. 1 Min | | |
| DEMO01003E | 4 Hrs. 4 Min | 99.3% | | | | 4 Hrs. 1 Min | | |
| DEMO01006D | 4 Hrs. 4 Min | 100.0% | | | | 4 Hrs. 4 Min | | |
| DEMO01007C | 4 Hrs. 4 Min | 100.0% | | | | 4 Hrs. 4 Min | | |
| DEMO01011B | 1 Hrs. 34 Min | 96.1% | | 1 Hrs. 29 Min | | | | |
| DEMO01012D | 4 Hrs. 4 Min | 100.0% | | | | 4 Hrs. 4 Min | | |
| DEMO01014A | 4 Hrs. 4 Min | 100.0% | | | | 4 Hrs. 4 Min | | |
| DEMO01018P | 4 Hrs. 4 Min | 99.1% | | | | 4 Hrs. 1 Min | | |
| DEMO01023B | 4 Hrs. 4 Min | 100.0% | | | | 4 Hrs. 4 Min | | |
| DEMO01024B | 8 Hrs. 32 Min | 100.0% | | | | | | 8 Hrs. 32 Min |
| DEMO01029P | 1 Hrs. 40 Min | 96.5% | | 1 Hrs. 37 Min | | | | |
| DEMO01030P | 1 Hrs. 40 Min | 99.9% | | 1 Hrs. 40 Min | | | | |
| DEMO01034B | 4 Hrs. 4 Min | 49.8% | | 1 Hrs. 44 Min | | | | |
| DEMO01043D | 4 Hrs. 4 Min | 100.0% | | | | 4 Hrs. 4 Min | | |
| DEMO01045C | 4 Hrs. 4 Min | 100.0% | | | | 4 Hrs. 4 Min | | |
| DEMO01047A | 4 Hrs. 4 Min | 100.0% | | | | 4 Hrs. 4 Min | | |

FIG. 6

Battery Runtime Estimator
Demonstration Carrier
Albuquerque NM
Estimated Runtime less than 3 Hours
Voltage Cut Off @ 1.75 VPC

| Site Information / Climate | Battery Information | Power Required | **Specifications Amps/Hr | Runtime | Currently Available** Amps/Hr | Runtime | % Spec |
|---|---|---|---|---|---|---|---|
| NM00001A Albuquerque, NM Unknown | EnerSys Inc. NP65-12 3 strings of 4 (Baseline value = 7,515) | 5,760 Watts 120 Amps | 195 | 0 Hrs. 55 Min | 195 | 0 Hrs. 55 Min | 100 |
| NM01005P Albuquerque, NM Unknown | EnerSys Inc. SBS-40 3 strings of 4 (Baseline value = 4,600) | 5,760 Watts 120 Amps | 111 | 0 Hrs. 29 Min | 37 | 0 Hrs. 1 Min | 33 |
| | | | *Warning! 2 strings with bad cell(s) or missing data! | | | | |
| NM01009P Albuquerque, NM Unknown | EnerSys Inc. SBS-40 2 strings of 4 (Baseline value = 4,600) | 3,840 Watts 80 Amps | 74 | 0 Hrs. 29 Min | 73 | 0 Hrs. 28 Min | 99 |

FIG. 7

BATTERY MANAGEMENT SYSTEM AND APPARATUS WITH RUNTIME ANALYSIS REPORTING

CROSS REFERENCE TO RELATED APPLICATION

This application is a continuation-in-part of, and claims priority to, U.S. application Ser. No. 11/025,816, filed Dec. 29, 2004, related to U.S. application Ser. No. 11/025,305, filed Dec. 29, 2004, both applications being continuations-in-part of U.S. application Ser. No. 10/749,004, filed Dec. 30, 2003 now U.S. Pat. No. 7,003,431, all of the foregoing being incorporated herein by reference in their entirety.

BACKGROUND OF THE INVENTION

The invention relates to the management of large stationary batteries. The invention is a comprehensive system and apparatus for the management of stationary batteries that are used for backup power and are deployed in widely dispersed locations. The OMS™ (Optimization Management Solution) solution is comprised of battery tags (sometimes referred to herein as "Mega-Tags," which are preferably serialized bar-coded identification labels), a battery testing and data acquisition device, and the OMS™ web-based software. These components work together to provide a platform for managing a large number of perishable, expensive, and geographically dispersed assets.

The invention solves many of the unique problems associated with batteries. Batteries are perishable. That is, they have a limited shelf-life and a limited useful life. Stationary industrial batteries of the type that benefit from the OMS™ solution are typically sealed lead-acid batteries. These electromechanical devices typically must be installed within 6-10 months from date of manufacture or else they need to be recharged. In addition, most of these batteries are designed for a 10 year useful life, but in the field generally last only from 2-6 years. The discrepancy between design life and actual life is a major problem for users of these batteries.

Stationary batteries are also large, heavy and expensive. They are generally used in large numbers to provide the required backup power. Keeping track of these devices therefore provides an additional asset management challenge.

Batteries contain hazardous substances which are toxic to the environment. There are strict rules and regulations governing the disposal of batteries. These rules and regulations also contain documentation requirements. Users must be able to provide adequate proof of compliance or face severe penalties. Documentation is a highly manual, expensive process, and most compliance is done as an afterthought.

Batteries are generally deployed in strings of two or four 12-volt units, in strings of three 12-volt units, or in strings of six or twelve 2-volt units, in order to power 24 volt, 36 volt or 48 volt equipment. Other string configurations are also possible. This electrical combination of batteries compounds the difficulty of managing these storage devices. In sum, managing stationary batteries is difficult, and is generally not a core competency of most businesses that use these batteries.

In order to have visibility into the state of health of a stationary battery plant, it is necessary to periodically test the batteries. Upon testing, gross failure of the batteries is apparent. However, in many cases, even where the batteries are in good condition there may be a deficiency of backup power due to changes in load requirements. This situation occurs frequently in many industries. For example, in a wireless telecommunications application, a battery backup plant might initially provide four hours of runtime; yet over time as additional communications gear is added to the transmission location, the batteries have to power a greater load and therefore provide less runtime. (Note that "runtime" refers to the length of time that the backup system can provide adequate power to keep the primary equipment operational.) Therefore it is important to compare the available backup power against to the current load requirement, in order to forecast the backup power runtime. The runtime analyzer automates this important function.

BRIEF SUMMARY OF THE INVENTION

The OMS™ (Optimization Management Solution) tracks batteries from cradle-to-grave. It enables companies with large deployments of stationary batteries to manage assets that are both perishable and geographically dispersed, and therefore difficult to mange. OMS™ is comprised of the following items which work together to provide this unique service: First, Mega-Tags (preferably serialized bar-coded identification labels) are affixed to every individual battery. A battery testing device (preferably the BatteryCorp BC-T2000 or BC Celltron Ultra or similar testing device), which contains both a bar code reader and a serial port to connect to a PC, scans a Mega-Tag and then performs its test on any given battery. Batteries are usually deployed in "strings" of electrically interconnected units to increase voltage and output power. Each battery test data point is stored along with the unique identifier value associated with the individual battery unit. The user connects the BatteryCorp BC-T2000 (or BC Celltron Ultra or similar testing device) to the serial port of a PC with the provided null-modem cable. Linking software (preferably the T2000 Link or Celltron Receive Utility software) facilitates the transfer of data from the testing and data acquisition device to the PC internal storage. The user then logs into the proprietary website and clicks on the Upload Data icon; OMS™ then uploads the specified data file to a proprietary web server. The web server processes the data file, storing the pertinent data in the appropriate tables of the OMS™ database.

The invention provides comprehensive reporting and analysis options. This includes both operational and financial reports, as well as detailed recycling documentation. The OMS™ auto-notification feature emails reminders to customer technicians that testing is required. These emails are based upon customer-defined business rules. (Testing time and escalation intervals may be specified by business unit.)

The OMS™ solution enables users of stationary batteries to manage all aspects of their battery deployments. It is the only available tool that automates the process of uniquely identifying, testing, evaluating and reporting on the state of health of any given battery. It provides information on installation, deployment, testing, recycling and destruction. It provides information in both aggregate and detail formats, for both internal and external use.

Its advantages are many. It enables users to manage large, widely dispersed deployments of stationary batteries in an efficient and cost effective manner. It increases the reliability of the backup power plant, because the operator now has information on the performance status of the batteries. The system also facilitates the safe recycling of potentially toxic devices, while reducing the risk of non-compliance with governmental regulations.

OMS™ applies customer business rules to the uploaded test data, and automatically instructs the technician as to which specific battery or batteries, by serial number, need to be replaced. The technician no longer has to make any decisions, thus removing subjectivity from the process. OMS™ both produces reports which detail the specifics of the batteries to be replaced, and it sends automated email messages to the appropriate technician, with the relevant installation instructions.

An optional module designed to run on the basic engine described above is a battery runtime analyzer and reporting mechanism. In order to have visibility into the state of health of a stationary battery plant, it is necessary to periodically test the batteries. Upon testing, gross failure of the batteries is apparent. However, in many cases, even where the batteries are in good condition there may be a deficiency of backup power due to changes in load requirements. This situation occurs frequently in many industries. For example, in a wireless telecommunications application, a battery backup plant might initially provide four hours of runtime; yet over time as additional communications gear is added to the transmission location, the batteries have to power a greater load and therefore provide less runtime. The "runtime" refers to the length of time that the backup system can provide adequate power to keep the primary equipment operational. Therefore it is important to compare the available backup power against to the current load requirement, in order to forecast the backup power runtime. The runtime analyzer automates this important function, both on a detail level and on an aggregate level. Thus a company can look at backup power availability at individual locations as well as various summary formats by business unit. This facilitates the enforcement of company, industry and/or governmental standards as appropriate.

Another object of the invention is to provide a battery management system easily applied to existing batteries without modification of the batteries, and that easily accommodates a varied inventory of batteries from different manufacturers.

Other objects and advantages will be more fully apparent from the following disclosure and appended claims.

BRIEF DESCRIPTION OF THE DRAWINGS

The above-mentioned and other features and objects of this invention and the manner of obtaining them will become apparent and the invention itself will be best understood by reference to the following description of an embodiment of the invention taken in conjunction with the accompanying drawings, wherein:

FIG. 5 is a sample corporate runtime summary report;

FIG. 6 is a sample runtime analysis summary for a business unit;

FIG. 7 is a sample battery runtime analysis detail report.

DETAILED DESCRIPTION

The invention provides and coordinates battery testing, maintenance, installation, fulfillment and disposal of batteries, and is capable of performing these functions over a wide geographical area. It seamlessly integrates these services via the BatteryCorp or similar ohmic testers and the OMS™ web based platform. This innovative solution helps companies improve their backup power systems while reducing costs.

Figure 1:
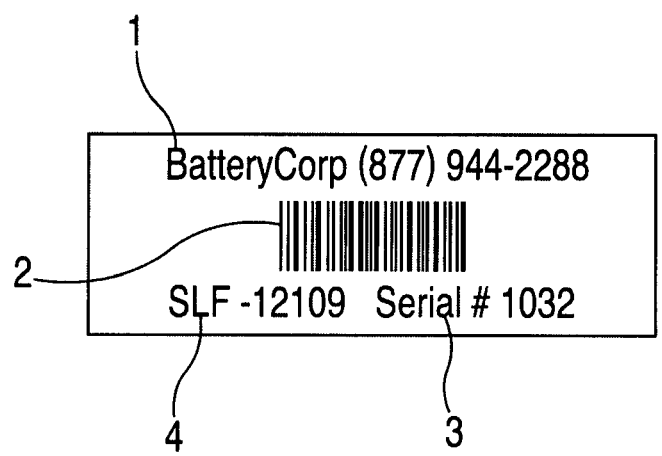
FIG. 1 is a representation of a tag for use with the present invention.
Figure 2:
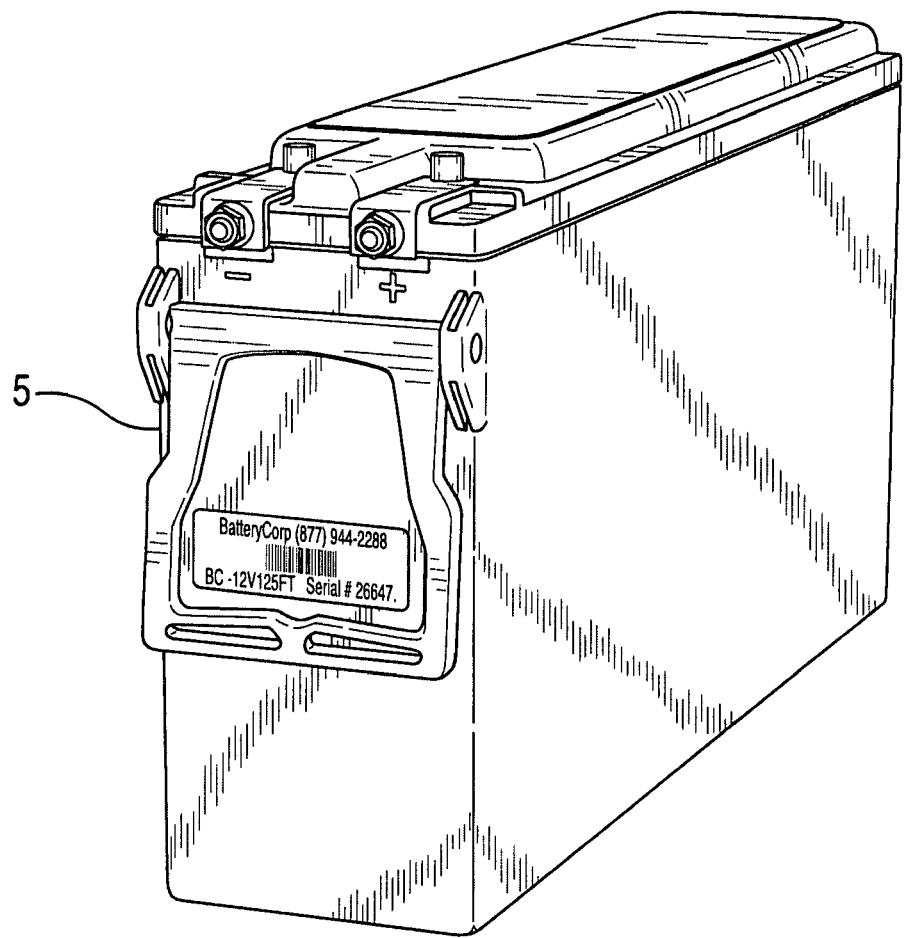
FIG. 2 is a perspective view of a battery unit with a tag associated with the battery.

FIG. 1 shows a preferred Mega-Tag to be associated with an individual battery. The tag is associated with a particular battery unit, so that the unique identification number embedded in the tag is consistently associated with that particular battery. Preferably to assure such continued association, the Mega-Tag is affixed to the exterior casing of the battery (5) with an adhesive, as shown in FIG. 2.

Mega-Tags are preferably bar coded labels that contain a unique identifier for the associated battery. The tag shown in FIG. 1 has, preferably, the following information: (1) the service provider name and telephone number; (2) the bar code of a unique identification number; (3) the battery model; and (d) the unique identification number in human readable form. Because of the preferred inclusion of human readable information in conjunction with the bar code identification number, the Mega-Tag is preferably affixed where it can be viewed and scanned by a human operator without dislocating the battery.

Figure 3:
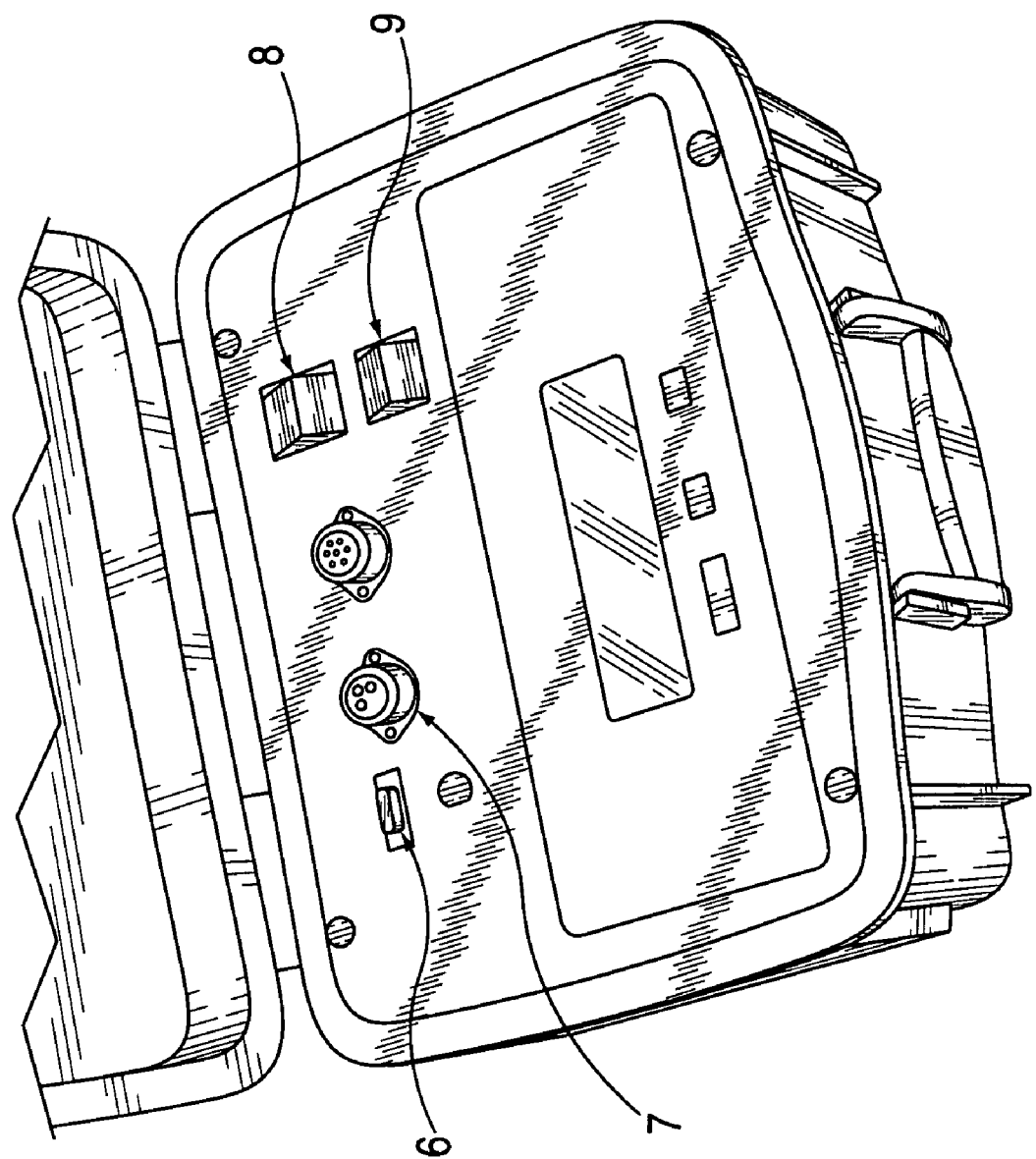
FIG. 3 is a view of a battery testing and data acquisition device for use with the present invention.

FIG. 3 shows a testing and data acquisition device for use with the present system. The device shown is a BatteryCorp BC-T2000 device. However, different testers could be used, but such testers should be able to import data from a bar code reader, and have the ability to export data files. The bar code scanner or reader is preferably in direct communication with the battery testing device for ease of use and reliable interface. This is preferably accomplished by use of a port (6) for a bar code reader and for connection to a computer. Also shown in FIG. 3 are ports for two testing probes (7), and A/C current in port (8) and an on/off switch (9). The data files can be in a number of formats, since the invention is a flexible platform with the ability to interface with data files in a number of formats.

In particular, the battery tester should be able to store test results in memory, associating each test with the pertinent unique scanned identifier. The tester also should be able to output the test results in an industry-standard file format, such as ASCII text or Excel XLS. The tester should be able to perform impedance or conductance testing (IEEE approved technologies). Many companies that utilize stationary batteries perform impedance or conductance tests. These test types are called ohmic testing. Many companies that utilize stationary batteries perform ohmic testing.

In an alternative embodiment, the tester may operate with an infra-red thermometer, either integrated with the battery tester or otherwise in communication with the tester. The thermometer would read the temperatures of individual batteries, and the temperature associated with the unique identifier for that particular unit. Such a thermometer would provide additional information concerning the subject battery unit that would be read, uploaded and stored. Such a thermometer would obviate the need for a separate thermometer to record ambient temperature surrounding the battery units, which is stored along with the battery test data, and provide a more accurate reading of individual unit temperatures.

The testing device files preferably have the following header information. First, a Location Code is included with the file. This is a code that links the database of the invention, indicating the location of the battery. Second, the ambient temperature is stored along with the test information, because battery temperature is correlated with life expectancy. This information is also required by many battery manufacturers for warranty claims.

The testing device files preferably have the following detail information. First, there is a Unique Identifier that identifies the individual battery unit. Second, the date and time of the test are included in the file. Third, the test value, which is the individual battery unit test result, typically either an impedance value or a conductance value. It is the key indicator of the battery's health. The greater the impedance or the lower the conductance (they are inverse measurements of the same attribute) the poorer the state of health of the battery. Fourth, a strap test value, which is optional. Strap testing is a test of the interconnection between the current battery itself and the next battery in sequence (in the string). Fifth, a voltage is included, which is the voltage measurement of the battery. Voltage is another indicator for battery health and is also an indicator of the status of the device which is used to charge the battery.

Database management is another component of the present invention. Each battery test data point is stored along with the unique identifier value associated with the individual battery unit. This enables trend analysis reporting and individual battery detail reporting.

In operation, the user connects the battery testing device to the serial or USB (Universal Serial Bus) port of a PC with a null-modem cable, a standard computer peripheral device which is readily available. The linking software facilitates the transfer of data from the testing and data acquisition device to the PC internal storage. Typically, the user clicks the "Transfer" button displayed on the graphical user interface (GUI) of the software. The response will be "Waiting for data." Prompts on the battery tester will guide the user to the menu option for downloading the data.

The user then logs in to the proprietary service provider website. The user will then click on the Upload Data icon displayed within the GUI. The linking software then uploads the specified data file to a proprietary web server. The web server processes the data file, storing the pertinent data in the appropriate tables of the OMS™ database.

Data elements stored include:
a. Unique ID
b. ID of the user who performed the test
c. Test date and time
d. Test type (Impedance or Conductance)
e. Test measurement value
f. Strap measurement value if applicable
g. Voltage
h. Ambient temperature The invention then generates comprehensive reporting and analysis, including preferably the following:
a. Battery Test History (detail by location)
b. Battery Test Summary (overview of tests and results)
c. Untested Batteries (verification tool)
d. Battery Installation Aging (based upon installation date)
e. Performance Status Report (analysis which groups batteries based upon user-defined status criteria for "pass", "fair", "warning" and "fail")
f. Replacement Forecast (analysis based upon user-defined criteria to estimate costs of upcoming replacements)

Auto-notification is another part of the present invention. This feature is based upon customer-defined business rules. These rules typically test interval and escalation procedure, automatic battery replacement intervals and escalation procedures. These business rules can be specified by customer-defined business units. Business units might be geographical areas, product line groupings, etc. This provides considerable flexibility for the user in how to utilize the automated notification process. All notifications are preferably made via email or other electronic transmission means.

Figure 4:
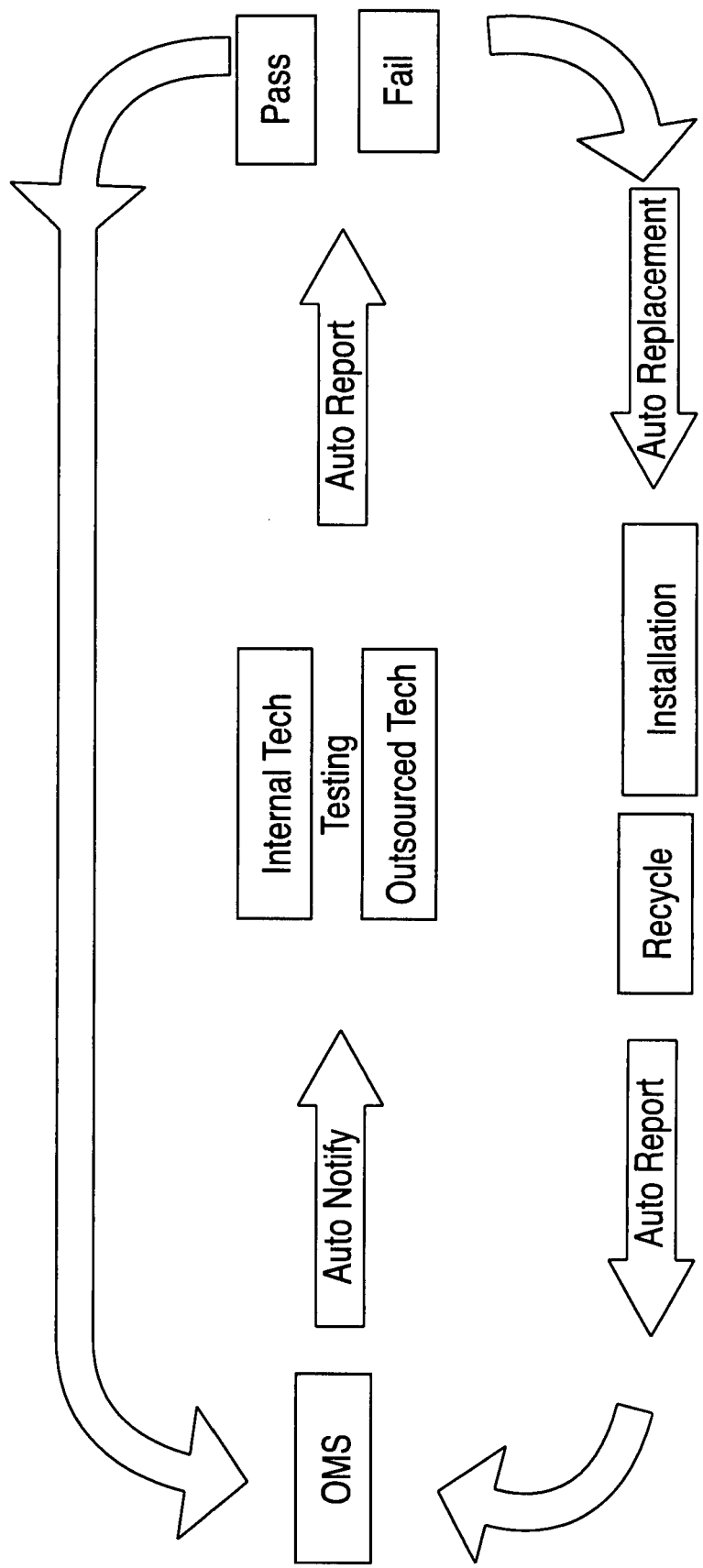
FIG. 4 is a flow diagram illustrating the process of the present invention.

FIG. 4 provides a high-level overview of the process of the present invention. The OMS™ software will send an automated email notification to the pertinent technician that various locations require battery testing. This process is called Auto Notification. The person that is informed of the required testing can be either an internal (i.e. employee of the customer company) or an outsourced (third party) technician. This Auto Notification feature is not required for functioning of the present invention, since users may utilize the OMS™ software with this feature disabled, and set up their testing schedule separately.

The technician tests the batteries with the batter tester and uploads the data via a network connection, preferably a global computer network such as the Internet, to the OMS™ proprietary database, preferably located on a server. Upon receipt of uploaded data files, the OMS™ software immediately processes the data and sends an automated report (Auto Report) back to the technician. The report will indicate whether the batteries all "Passed," or if any "Failed" the test. The report may also provide instructions to the technician on whether or not to replace any given battery or all batteries, depending upon the business rules for that customer (Auto Replacement). If Auto Replacement is enabled, the OMS™ software will route the appropriate information to the pertinent installation technician. The OMS™ software may provide recycling documentation, so that batteries being replaced may be properly recycled.

An Auto Report is generated via the battery tester and sent via a network connection, preferably through a global computer network such as the Internet, to the OMS™ proprietary software and to the OMS™ database.

The OMS™ software platform has been built using programming tools from Microsoft. The integrated development environment (IDE) includes productivity boosting features such as automated syntax management, a powerful editor, line-by-line debugging, graphical design tools (including visual classes and subclasses), and integrated database access. The platform is fully object-oriented, offering developers the benefits of full inheritance, encapsulation and polymorphism. This dramatically reduces design, coding, and testing times, producing a highly efficient rapid application development (RAD) environment.

The methodology employed in the OMS™ platform can be referred to as business function modeling (BFM). The entire orientation of the development effort revolves around the business rules and processes. This may also be referred to as an object functional model. Each function encapsulates a particular business task, yet from a development point of view it also inherits any and all system functions necessary to perform the intended task.) For example, a purchase order object would accept the request, access the necessary data, employ all pertinent business rules, validate the posted data, update the database, and generate a response—all within a single software object. This is a major architectural advantage.

The runtime analysis module is built on the basic system, with or without options such as replacement or redeployment methodology or other reporting modules such as anomaly reporting. The runtime analysis module provides a report of estimated runtime based on both battery and equipment specifications, and actual state of health compared to current load measurements. The runtime analysis module provides critical information for backup operational planning purposes.

In many cases, even where the batteries are in good condition there may be a deficiency of backup power due to changes in load requirements. This situation occurs frequently in many industries. For example, in a wireless telecommunications application, a battery backup plant might initially provide four hours of runtime; yet over time as additional communications gear is added to the transmission location, the batteries have to power a greater load and therefore provide less runtime. As used herein, "runtime" refers to the length of time that a backup system can provide adequate power to keep the primary equipment operational. Therefore it is important to compare the available backup power against to the current load requirement, in order to forecast the backup power runtime. The runtime analyzer automates this important function, both on a detail level and on an aggregate level. Thus a company can look at backup power availability at individual locations as well as various summary formats by business unit. This facilitates the enforcement of company, industry and/or governmental standards as appropriate.

The runtime analyzer requires as input battery test data and load information by equipment type. The processing steps consist of:

User interface prompts the requestor for scope information, such as which business units to include in the report.

The runtime analyzer then queries the database for the most recent battery test results for the selected locations.

The equipment listed for each location is queried and the total load for each location is computed.

For each string of batteries at the location, the available power is computed based upon both the most recent test results and upon the new battery specification.

Total available power is computed for each location, for both new batteries and for the current situation.

Estimated runtime is computed based upon the power requirement compared to available power, and is adjusted based upon temperature. The battery discharge curve is utilized to compute the runtime. This is a technical specification that is routinely provided by battery manufacturers for each of their battery models. It describes the relationship between load and the amount of time that the battery can supply power (amps) at the requisite voltage.

Estimated runtime is displayed as both "specifications" (how much would be available with new batteries based upon the total load) and "current" (how much is available based upon the total load and the current state of health of the batteries).

A sample corporate runtime summary report is shown in FIG. 5. This preferred mode of reporting includes the following details:

Name of company;
Name of each business unit reporting.

All remaining information depicted both by business unit and overall:

Total number of locations;
Number of locations tested;
Percent of locations tested;
Count of locations and percentage of total with under one hour of available runtime;
Count of locations and percentage of total with one to two hours of available runtime;
Count of locations and percentage of total with two to four hours of available runtime;
Count of locations and percentage of total with four to six hours of available runtime;
Count of locations and percentage of total with six to eight hours of available runtime;
Count of locations and percentage of total with more than eight hours of available runtime.

A sample business unit runtime analysis report is shown in FIG. 6. This preferred mode of reporting includes the following details:

Name of company
Name of business unit reporting;
Method used to sort output, which could be either alphabetic by location name, best-to-worst performance, worst-to-best performance, or percent of specification;
Average runtime in hours and minutes;
Average percentage of specification;
Counts of the number of locations where the runtime is under one hour, from one to two hours, from two to four hours, from four to six hours, from six to eight hours, or over eight hours.

All remaining information depicted by each battery deployment location:

Runtime at specification, in hours and minutes;
Actual runtime as a percent of specification;
Actual runtime in hours and minutes, displayed under the appropriate column where each column depicts a range of hours, from under one hour, from one to two hours, from two to four hours, from four to six hours, from six to eight hours, or over eight hours.

A sample battery runtime detail report is shown in FIG. 7. The report details preferably include:

Name of company;
Business unit name;
User specification for report (i.e. a specific runtime criterion in hours).

Detailed report information may include:

Location information and climate type;
Battery manufacturer, model, quantity and baseline test value;
Power requirement in both amps and watts;
Output provided by new batteries, as currently configured at the location;
Computed runtime in hours and minutes, based upon total load with new batteries;
Output provided by current batteries, per most recent battery test results;
Computed runtime in hours and minutes, based upon total load with existing batteries, expressed as a minimum and maximum.

Finally, the OMS™ platform contains a rich set of connectivity tools. It can easily import/export data in various formats, from plain text to delimited files to Excel to XML. In fact, the battery tester upload module accepts data in both text and XLS formats. OMS™ can also directly access any ODBC compliant data source, such as Oracle, DB2 and other databases. However, we expect that the XML classes in particular will facilitate seamless communication between OMS™ and any related systems.

The specific products utilized to build OMS™
Microsoft Visual FoxPro 7.0 (IDE)
West Wind Web Connection (Base classes for web services)

Macromedia HomeSite (HTML/JavaScript editor; any can be used)
IDAutomation.com bar code fonts
Adobe Acrobat 5.0

Web Connect by West Wind Technologies is a framework of base classes for building web applications. These classes perform all low-level functions for authentication, request management, session management, data formatting and output. It may be preferable to use updated versions of the above programs as they become available.

Since other modifications or changes will be apparent to those skilled in the art, there have been described above the principles of this invention in connection with specific apparatus, it is to be clearly understood that this description is made only by way of example and not as a limitation to the scope of the invention.

What is claimed is:

1. A method of estimating and reporting battery runtime, comprising the steps of:
   acquiring a location of a battery unit;
   querying a database for test results associated with the location;
   querying the database for a list of equipment;
   calculating a load total for the list of equipment;
   calculating a measure of available power for the location based upon the test results and battery specifications;
   calculating total available power for the location;
   calculating estimated runtime based upon a power requirement compared to available power;
   displaying a result based upon estimated runtime.

2. The method of claim 1, wherein the battery unit comprises a string of batteries.

3. The method of claim 1, wherein the result is displayed as a time period dependent on new batteries and upon the total load.

4. The method of claim 1, wherein the result is displayed as a time period dependent on actual batteries in use and upon the total load.

5. The method of claim 1, further comprising the step of using a battery discharge curve to compute the estimated runtime.

6. A computer readable medium containing computer instructions for managing batteries and providing a report of estimated battery runtime, the computer readable medium comprising:
   computer program code for acquiring a location of a battery unit;
   computer program code for querying a database for test results associated with the location;
   computer program code for querying the database for a list of equipment;
   computer program code for calculating a load total for the list of equipment;
   computer program code for calculating a measure of available power for the battery unit based upon the test results and battery specifications;
   computer program code for calculating total available power for the location;
   computer program code for calculating estimated runtime based upon a power requirement compared to available power;
   computer program code for displaying a result based upon estimated runtime.

7. The computer readable medium as recited in claim 6, wherein the battery unit comprises a string of batteries.

8. The computer readable medium as recited in claim 6, wherein the result is displayed as a time period dependent on new batteries and upon the total load.

9. The computer readable medium as recited in claim 6, wherein the result is displayed as a time period dependent on actual batteries in use and upon the total load.

10. The computer readable medium as recited in claim 6, further comprising computer program code for using a battery discharge curve to compute the estimated runtime.

11. A method of estimating and reporting battery runtime, comprising the steps of:
    acquiring a location of a battery unit;
    querying a database for test results associated with the location;
    querying the database for a list of equipment;
    calculating a load total for the list of equipment;
    calculating a measure of available power for the location based upon the test results and battery specifications;
    calculating total available power for the location;
    calculating estimated runtime based upon a power requirement compared to available power;
    adjusting the estimated runtime based upon a temperature associated with the battery unit;
    displaying a result based upon estimated runtime.

12. A computer readable medium containing computer instructions for managing batteries and providing a report of estimated battery runtime, the computer readable medium comprising:
    computer program code for acquiring a location of a battery unit;
    computer program code for querying a database for test results associated with the location;
    computer program code for querying the database for a list of equipment;
    computer program code for calculating a load total for the list of equipment;
    computer program code for calculating a measure of available power for the battery unit based upon the test results and battery specifications;
    computer program code for calculating total available power for the location;
    computer program code for calculating estimated runtime based upon a power requirement compared to available power;
    computer program code for adjusting the estimated runtime based upon a temperature associated with the battery unit;
    computer program code for displaying a result based upon estimated runtime.

* * * * *